United States Patent [19]
Sindzingre et al.

[11] Patent Number: 5,807,614
[45] Date of Patent: Sep. 15, 1998

[54] METHOD AND DEVICE FOR FORMING AN EXCITED GASEOUS ATMOSPHERE LACKING ELECTRICALLY CHARGED SPECIES USED FOR TREATING NONMETALLIC SUBSTRATES

[75] Inventors: Thierry Sindzingre, Cachan; Stéphane Rabia, Gif sur Yvette; François Coeuret, Guyancourt, all of France

[73] Assignee: L'Air Liquide, Societe Anonyme pour l'Etude et l'Exploitation des Procedes Georges Claude, Paris, France

[21] Appl. No.: 640,802

[22] PCT Filed: Dec. 7, 1994

[86] PCT No.: PCT/FR94/01422

§ 371 Date: Jun. 5, 1996

§ 102(e) Date: Jun. 5, 1996

[87] PCT Pub. No.: WO95/16801

PCT Pub. Date: Jun. 22, 1995

[30] Foreign Application Priority Data

Dec. 15, 1993 [FR] France .................. 93 15111

[51] Int. Cl.$^6$ .................................................. C23C 16/22
[52] U.S. Cl. ..................... 427/540; 427/551; 427/553; 427/557; 427/562; 427/563; 427/574; 427/578; 427/579; 427/255.1; 427/255.2; 427/255.5; 427/255.7; 427/585; 118/719; 118/723 ER; 118/729
[58] Field of Search ................... 427/532, 540, 427/551, 553, 557, 562, 563, 574, 578, 579, 255.1, 255.2, 255.5, 255.7, 585; 118/719, 723 ER, 729

[56] References Cited

U.S. PATENT DOCUMENTS

| | | | |
|---|---|---|---|
| 4,774,062 | 9/1988 | Heinemann | 422/186.19 |
| 4,951,602 | 8/1990 | Hanai | 118/719 |
| 5,114,529 | 5/1992 | Masuyama et al. | 156/643 |
| 5,124,173 | 6/1992 | Uchiyama et al. | 427/38 |
| 5,458,856 | 10/1995 | Marie et al. | 422/186 |

FOREIGN PATENT DOCUMENTS 513634  11/1992  European Pat. Off. .

Primary Examiner—Shrive Beck
Assistant Examiner—Timothy Meeks
Attorney, Agent, or Firm—Burns, Doane, Swecker & Mathis, L.L.P.

[57] ABSTRACT

A method of forming a gaseous treatment atmosphere capable of depositing a silicon-containing film on a nonmetallic substrate comprising the steps of:

converting an initial treatment gas mixture into a primary treatment gas mixture in an apparatus for forming excited or unstable gas species, the primary treatment gas mixture comprising excited or unstable gaseous species substantially devoid of electrically charged species, combining the primary treatment gas mixture with an adjacent treatment gas mixture which comprises at least one gaseous silicon precursor which has not passed through the apparatus, to form the gaseous treatment atmosphere.

27 Claims, 1 Drawing Sheet

METHOD AND DEVICE FOR FORMING AN EXCITED GASEOUS ATMOSPHERE LACKING ELECTRICALLY CHARGED SPECIES USED FOR TREATING NONMETALLIC SUBSTRATES

BACKGROUND OF THE INVENTION

1. Field of the Invention

The invention relates to the field of surface treatment of nonmetallic substrates, in particular polymer, textile (fibers or pieces of wool, cotton, etc.), paper or glass substrates or alternatively wood, plaster or tile substrates, whether these substrates are flat or whether they are in the form of a volume. These surface treatments are usually performed for the purpose of improving the adhesion and wettability behavior of these substrates.

2. Description of the Related Art

Surface treatment of the non-metallic substrates have formed the subject of a large number of studies, especially enabling the following categories of methods to be listed:

liquid-phase treatment;

plasma treatment (at low pressure);

corona discharge treatment;

flame brushing; and silica deposition in plasma gas phase or by sputtering.

However, these methods are not completely satisfactory and have a certain number of non-negligible drawbacks.

Thus, as regards flame brushing, the method proves to be difficult to control, in particular difficult to apply to nonplanar surfaces.

The drawbacks of the liquid-phase methods are associated with environmental problems, especially because of the reprocessing of the solutions before disposal, but they are also associated with problems of drying after treatment.

As regards plasma treatments, whether these treatments are used to activate the surface of the substrate or to deposit silica on this surface, they are usually performed under vacuum or under low pressure, which is complex and the excessive cost of which cannot be ignored and is relatively incompatible with the low added value of these products, especially polymers.

In this context, the Applicant has recently proposed, in document FR-A-2,670,506, a process for the deposition of a thin layer of silicon oxide on a polyolefin substrate. This process made it possible, successively or concomitantly, to preactivate the polymer surface by corona discharge and then to deposit a layer of silicon oxide by exposing the surface thus preactivated to a silane-containing atmosphere, this process being carried out at atmospheric pressure.

Although this process indubitably constitutes an advance compared to the existing techniques, the Applicant has demonstrated the fact that it may be improved, especially in that:

the distance between the specimen to be treated and the electrode is critical for obtaining perfectly homogeneous treatment, constituting a constraint when it is necessary to treat substrates of variable thickness or of thickness which varies from one substrate to another;

on the other hand, implementation of the process requires that the substrates pass within the discharge, resulting in a source of contamination for the electrodes because of the presence of dust or fatty particles on the surface of these substrates;

when the process carries out preactivation and deposition concomitantly, the gaseous silicon precursor (silane) is introduced directly into the discharge, leading to the risk of depositing silicon oxides on the electrodes;

finally, the geometrical configuration enabling this process to be implemented limited the power density which could be employed, increasing the power density above this limit running the risk of causing delocalization of the ionized cloud;

moreover, in such a corona discharge configuration, the substrate is exposed to a plasma which, as its name indicates, includes electrically charged species, this situation not being without problems in the case of insulating materials, as polymers are, in which a charge build-up occurs.

In a more general context, the Applicant in document FR-A-2,692,730, the content of which is assumed to be incorporated here for reference, has recently proposed a device for forming excited or unstable molecules which operate substantially at atmospheric pressure and enable enhanced energy densities to be achieved.

SUMMARY OF THE INVENTION

In this context, the subject of the present invention is to propose an improved process for forming a deposition of a silicon-containing film on a nonmetallic substrate, making it possible:

to operate at atmospheric pressure;

to work at low temperature, depending on the substrate in question;

to provide great flexibility in the distance between the object to be treated and the device used to carry out this treatment;

to provide an enhanced energy density, enabling an increased rate of treatment to be achieved;

to avoid bringing the substrate into contact with electrically charged species;

to prevent the gaseous silicon precursor used from being placed in a situation giving rise to reactions inside the device in question (powder deposition); and to avoid the substrate, on which the deposition is to be carried out, having to pass into this device.

In order to achieve this, according to the invention, in order to form a deposition of a silicon-containing film on a nonmetallic substrate, a downstream apparatus for forming excited or unstable gaseous species is used, in which an initial treatment gas mixture is converted into a primary treatment gas mixture, the downstream apparatus being the site of an electrical discharge created between a first electrode and a second electrode which extend in an elongate principal direction, the initial treatment gas mixture passing through the discharge transversely to the electrodes and to this principal direction, the primary treatment gas mixture, obtained at the gas outlet of the apparatus, which comprises excited or unstable gaseous species and which is substantially devoid of electrically charged species, forming, with an adjacent treatment gas mixture which comprises at least one gaseous silicon precursor and which has not passed through the apparatus, the gaseous treatment atmosphere which is brought into contact with the substrate in order to carry out the deposition.

A layer of a dielectric material is advantageously placed on the surface of at least one of the electrodes, opposite the other electrode.

The energy consumed in the downstream apparatus, expressed as energy per unit surface area of dielectric, will then advantageously be greater than 1 W/cm$^2$, preferably greater than 10 W/cm$^2$.

The gaseous treatment atmosphere is advantageously brought into contact with the substrate, in order to carry out the deposition, at a pressure close to atmospheric pressure.

Pressure close to atmospheric pressure is understood to mean, according to the invention, a pressure within the $[0.1 \times 10^5$ Pa–$3 \times 10^5$ Pa$]$ range.

Nonmetallic substrate is understood to mean, according to the invention, a substrate in an organic, or alternatively ceramic, material for example polymer, textile (fibers or pieces of cotton wool, etc.), paper, glass or alternatively wood, plaster or tile, whether these substrates are flat or whether they are in the form of a volume.

The expression "gaseous silicon precursor" is understood to mean, according to the invention, a gas such as, for example, silane, disilane or any other gaseous precursor conventionally used for such silicon-based deposition applications.

According to one of the aspects of the invention, the substrate will have been subjected beforehand to surface preparation by being brought into contact with a gaseous surface-preparation atmosphere, the gaseous preparation atmosphere comprising a primary preparation gas mixture and, if appropriate, an adjacent preparation gas mixture, the primary preparation gas mixture being obtained at the gas outlet of at least one upstream apparatus for forming excited or unstable gaseous species, in which an initial preparation gas mixture, comprising a reducing gas or an oxidizing gas and, if appropriate, at least one inert gas, has been converted, the primary preparation gas mixture being substantially devoid of electrically charged species and the adjacent preparation gas mixture not having passed through the upstream apparatus and not containing any gaseous silicon precursor.

Here too, the contacting with the gaseous surface-preparation atmosphere will advantageously take place at a pressure close to atmospheric.

The upstream apparatus according to the invention consists of any device enabling the initial preparation gas mixture to be "excited", in order to obtain, as gas output from the apparatus, another gas mixture which includes unstable or excited gaseous species, this latter (primary preparation) gas mixture being substantially devoid of electrically charged species, and therefore of ions or electrons.

Such an upstream apparatus, in which the initial preparation gas mixture is converted, is advantageously the site of an electrical discharge created between a first electrode and a second electrode, both extending in an elongate principal direction, the initial preparation gas mixture passing through the discharge transversely to the electrodes and to this principal direction.

A layer of a dielectric material is advantageously placed on the surface of at least one of the electrodes, opposite the other electrode.

The energy consumed in the upstream apparatus, expressed as energy per unit surface area of dielectric, will then advantageously be greater than 1 W/cm$^2$, preferably greater than 10 W/cm$^2$.

As will become clearly apparent to the person skilled in the art, the treatment atmosphere according to the invention is obtained by combining the primary treatment gas mixture, obtained as output from such an apparatus (termed downstream apparatus) for forming excited or unstable gaseous species, which primary treatment gas mixture therefore comprises such excited or unstable gaseous species, with the adjacent treatment gas mixture, the primary treatment gas mixture transferring all or part of its energy to the gaseous silicon precursor contained in the adjacent treatment gas mixture and to the surface of the substrate to be treated, thus enabling the deposition to be carried out.

Likewise, the preparation atmosphere, according to the invention, is obtained by combining the primary preparation gas mixture, obtained as output from such an apparatus (termed upstream apparatus) for forming excited or unstable gaseous species, which primary preparation gas mixture therefore comprises such excited or unstable gaseous species, with, if appropriate, the adjacent preparation gas mixture.

Since the gaseous silicon precursor has not passed through the downstream apparatus, the risk of depositing silica powder (or more generally a powder of silicon compound) within the discharge is consequently eliminated. Moreover, the substrate is in contact only with the gas outlet of the apparatus in question, not having "resided" in the apparatus.

This configuration may be termed a "remote" configuration since the primary component of the treatment atmosphere, which comprises excited or unstable gaseous species, is obtained at the output of the apparatus, ensuring the substantial absence of any electrically charged species in this primary component. The adjacent component of the treatment atmosphere, which has not passed through the apparatus, is a *fortiori* devoid thereof.

Moreover, this configuration enables the point of generation of the primary component of the atmosphere to be clearly separated from the point where it is used, this having a non-negligible advantage in terms of contamination of the apparatus (prevention of the various materials released, resulting from the deposition operation, from ending up contaminating the inside of the apparatus, for example its electrodes). Finally, the workpiece, which is not treated within the apparatus (for example within the discharge between the electrodes), benefits from a much greater flexibility with regard to the "distance" aspect mentioned earlier.

The nature and structure of the silicon compound deposited ($SiO_XN_Y$, $SiO_X$ or indeed $SiO_XN_YH_Z$) will be closely associated with the experimental conditions used, especially the partial pressures of oxygen and nitrogen in the treatment atmosphere. For example, it will be possible to control the nature of the film deposited by varying especially the nature of the inert gas used, both in the initial treatment mixture and in the adjacent treatment mixture, but also varying the level of oxygen partial pressure maintained within the treatment atmosphere.

As will become clearly apparent to the person skilled in the art, the substrate to be treated, both for the treatment operation proper and for the preliminary surface-preparation operation, may be brought into contact with the gas outlet of a single apparatus or with the gas outlets of several apparatuses for forming excited or unstable gaseous species, placed in parallel over the width of the substrate or successively with the gas outlets of several apparatuses for forming excited or unstable gaseous species, placed in series.

Similarly, the treatment operation proper, like the preliminary surface-preparation operation, may involve only one of the faces of the substrate, or both its faces. In the latter case, it will be convenient to place the apparatuses required opposite each face of the workpiece.

As will also clearly become apparent to the person skilled in the art, the apparatus or apparatuses (of the upstream kind) for forming excited or unstable gaseous species used during the surface-preparation operation may be identical or have different structures from the apparatus or apparatuses (of the downstream kind) used for the treatment operation proper.

If appropriate, the substrate to be treated will be subjected beforehand to another surface-preparation step according to any of the many methods available, whether in liquid phase or in gas phase.

According to one of the ways of implementing the invention, the initial treatment gas mixture comprises an inert gas and/or a reducing gas and/or an oxidizing gas. The inert gas may, for example, consist of nitrogen, argon, helium or a mixture of such inert gases. The reducing gas may, for example, consist of hydrogen, $CH_4$ or alternatively ammonia or a mixture of such reducing gases. As for the oxidizing gas, this may, for example, consist of oxygen, $CO_2$ or alternatively of $N_2O$, $H_2O$, or a mixture of such oxidizing gases. The list of gases given in each category, being purely indicative, is in no way limiting.

The adjacent treatment gas mixture will advantageously comprise, apart from the gaseous silicon precursor or precursors, an inert gas and/or a reducing gas and will comprise, if appropriate, an oxidizing gas. According to one of the ways of implementing the invention, the gaseous silicon precursor of the adjacent treatment gas mixture is monosilane $SiH_4$.

In contrast, in the case of the adjacent preparation gas mixture, which according to the invention is devoid of gaseous silicon precursors, it will advantageously comprise an inert gas and/or a reducing gas and/or an oxidizing gas.

According to one of the aspects of the invention, the substrate to be treated is heated to a temperature lying between room temperature and 200° C. As will become clearly apparent to the person skilled in the art, the temperature employed will depend very greatly on the substrate treated, but it may, for example, be reduced (or even held at room temperature) in the case of polymers incapable of withstanding high temperatures.

According to one of the ways of implementing the invention, the substrate to be treated is brought opposite the gas outlet of the downstream apparatus for forming excited or unstable gaseous species, if appropriate opposite the gas outlets of several downstream apparatuses placed in parallel over the width of the substrate and/or successively opposite the gas outlets of several downstream apparatuses placed in series by a conveying system passing through an internal space delimited by a downstream shrouding assembly (for example a tunnel or an assembly of elementary shrouding elements), which is isolated from the surrounding atmosphere, said downstream assembly being sealably connected to said downstream apparatus or including said downstream apparatus.

According to another way of implementing the invention, the substrate, the surface of which is to be prepared, is brought opposite the gas outlet of the upstream apparatus for forming excited or unstable gaseous species, if appropriate opposite the gas outlets of several upstream apparatuses placed in parallel over the width of the substrate and/or successively opposite the gas outlets of several upstream apparatuses placed in series by a conveying system passing through an internal space delimited by an upstream shrouding assembly, which is isolated from the surrounding atmosphere, said upstream assembly being sealably connected to said upstream apparatus or including said upstream apparatus.

It is then advantageously possible to pass continuously from the upstream tunnel or assembly to the downstream tunnel or assembly.

According to one of the ways of implementing the invention, the treatment atmosphere successively encountered by the workpiece to be treated is zoned along the conveyor in the following manner:

a) at least one of the downstream apparatuses for forming excited or unstable gaseous species converts an initial treatment gas mixture different from that converted by the downstream apparatus preceding it in said assembly, and/or b) the adjacent treatment gas mixture employed with at least one of the downstream apparatuses for forming excited or unstable gaseous species is different from that employed with the downstream apparatus preceding it in said assembly.

According to one of the ways of implementing the invention, steps a) and b) above may relate to the same downstream apparatus.

Thus it will be possible, for example, to use mixtures whose reducing power increases from one apparatus to another, or alternatively to vary this "successive composition of the treatment atmosphere" parameter in order to produce multilayer depositions, each layer having different and controlled thicknesses and structures.

According to another way of implementing the invention, the preparation atmosphere successively encountered by the workpiece, the surface of which is to be prepared, is zoned along the conveyor in the following manner:

a) at least one of the upstream apparatuses for forming excited or unstable gaseous species converts an initial preparation gas mixture different from that converted by the upstream apparatus preceding it in said assembly, and/or b) the adjacent preparation gas mixture employed with at least one of the upstream apparatuses for forming excited or unstable gaseous species is different from that employed with the upstream apparatus preceding it in said assembly.

According to one of the ways of implementing the invention, steps a) and b) above may relate to the same upstream apparatus.

The invention also relates to a device, especially suitable for implementing the invention, comprising a shrouding assembly defining an internal space through which means pass for conveying the nonmetallic substrates to be treated, which space is isolated from the surrounding atmosphere, sealably connecting or including one or more apparatuses for forming excited or unstable gaseous species, mounted in series and/or parallel, comprising at least one tubular gas passage having an axis, formed between an outer electrode and an inner electrode, one at least of the electrodes having, opposite the other, a dielectric coating, the electrodes being connected to a high-voltage high-frequency source, the outer electrode surrounding the dielectric and having an initial gas inlet and a primary gas outlet which are elongate, parallel to the axis and substantially diametrically opposed, said gas outlet emerging into said assembly, which is provided with at least one means for injecting an adjacent gas which has not passed through said apparatus or apparatuses.

Other characteristics and advantages of the present invention will emerge from the following description of an embodiment, given by way of illustration but in no way implying limitation, in conjunction with the appended drawings in which:

DETAILED DESCRIPTION OF PREFERRED EMBODIMENTS

Figure 1:
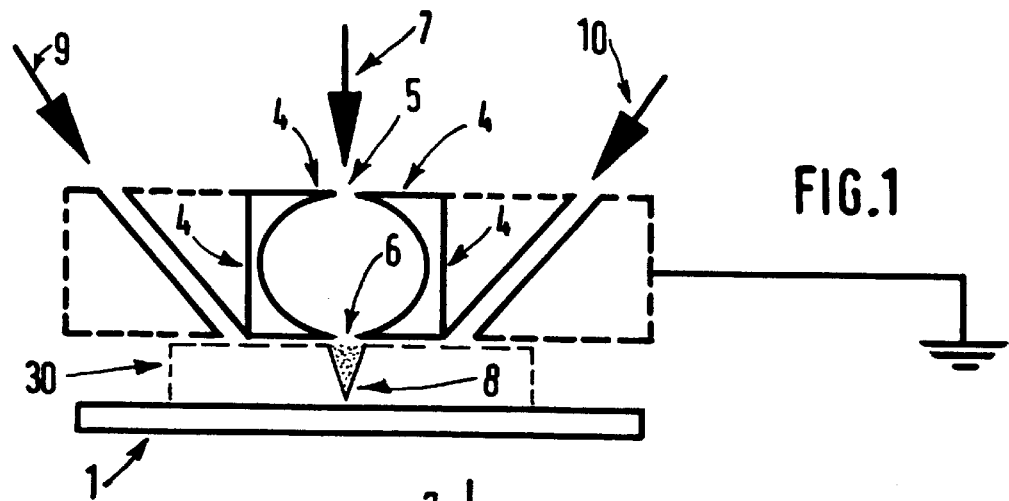
FIG. 1 is a diagrammatic representation of a simplified device suitable for implementing the invention.

Drawn schematically in FIG. 1 at 4 is an apparatus for forming unstable or excited gaseous species (so-called "downstream" apparatus, given that it is used to carry out the deposition), which is fed at its gas inlet 5 with an initial treatment gas mixture 7. A primary treatment gas mixture 8 is obtained at the gas outlet 6. A substrate 1 placed opposite this gas outlet 6 is furthermore subjected to an adjacent treatment mixture which arrives, in the embodiment shown, via two gas inlets 9, 10, this adjacent treatment mixture not passing through the apparatus 4 for forming excited or unstable gaseous species.

The zone where the primary and adjacent treatment gas mixtures interact so as to produce the silicon-containing deposition on the substrate 1 has been represented in this FIG. 1 by the dashed-line rectangle 30.

Figure 2:
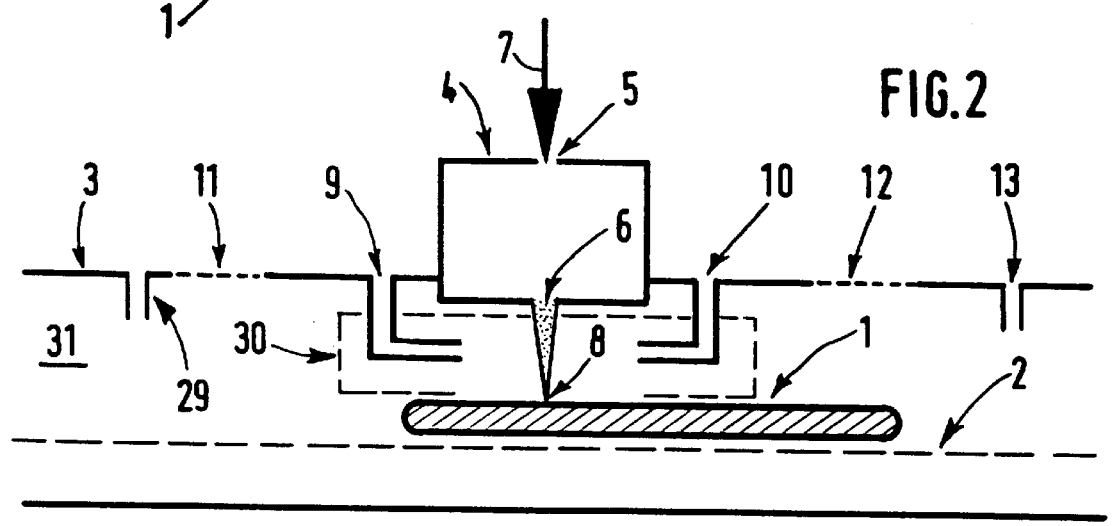
FIG. 2 is a diagrammatic representation of an embodiment of the invention, comprising a tunnel.

In FIG. 2, which is one particular embodiment of the invention, a tunnel 3 may be recognized delimiting an internal space 31 through which the substrate 1 is conveyed by a conveying means 2.

The substrate 1 is brought opposite the gas outlet 6 of a (downstream) apparatus 4 for forming excited or unstable gaseous species where it comes into contact with the primary treatment gas mixture 8 obtained from the initial treatment mixture 7 and with the adjacent treatment mixture which enters via gas inlets 9 and 10, this adjacent treatment mixture itself not having passed through the apparatus 4.

Here too, the zone of interaction between the primary treatment gas mixture 8 and the adjacent treatment mixture arriving via the gas inlets 9 and 10 has been shown diagrammatically by the dashed-line rectangle 30.

The embodiment shown in FIG. 2 makes it possible to treat the substrate 1 by means of several downstream apparatuses for forming unstable or excited gaseous species placed in series, the apparatuses placed at 11 and 12 not having been shown; the references 13 and 29 illustrate additional examples of adjacent treatment mixture inlets.

It should be noted that the apparatus for forming excited or unstable gaseous species at point 11 could also be of the "upstream" kind and therefore could be used to carry out the preliminary surface-preparation step according to the invention, the corresponding adjacent preparation gas mixture (29) itself then not containing any gaseous silicon precursor.

Figure 3:
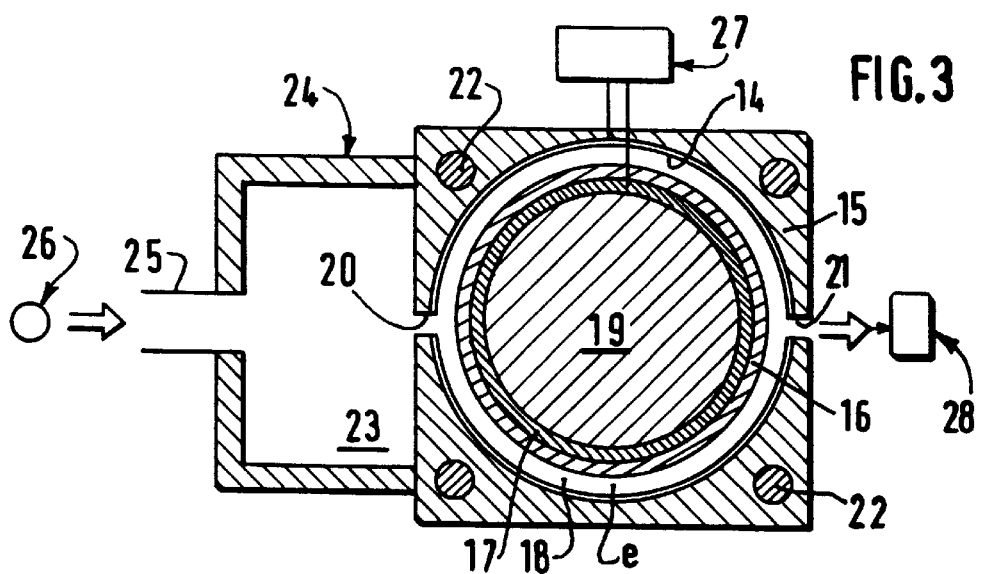
FIG. 3 is a diagrammatic representation, in cross section, of an apparatus for forming excited or unstable gaseous species suitable for implementing the invention.

In FIG. 3, which diagrammatically represents a cross section of an apparatus for forming excited or unstable gaseous species suitable for implementing the invention, whether for an apparatus of the upstream or downstream kind (which apparatus has a cylindrical geometry for this embodiment), a first tubular electrode 14 may be recognized, formed, for example, by an internal face of a metal block 15 and in which is placed, concentrically, an assembly comprising a tube made of dielectric material 16, for example ceramic, on the internal face of which is deposited, by metallization, a second electrode 17 (shown with an exaggerated thickness in FIG. 3 in order to make it easier to understand).

The assembly comprising the dielectric 16 and the second electrode 17 which are thus defined [sic] with the first electrode 14, a tubular gas passage 18 and, on the inside, an internal volume 19 through which flows a refrigerant, advantageously a Freon because of its electronegative character, or else deionized water.

The internal gas passage 18 has an axial extension of less than 1 m, typically less than 50 cm, and its radial thickness e does not exceed 3 mm and is typically less than 2.5 mm. The block 15 has two diametrically opposed longitudinal slots 20 and 21 forming, respectively, the inlet for the initial gas to be excited in the passage 18 and the outlet for the flux of primary gas containing excited or unstable species.

The slots 20 and 21 extend over the entire axial length of the cavity 18 and have a height which, for the embodiment shown, does not exceed the thickness e and is typically substantially identical to the latter.

The body 15 is advantageously formed, at the periphery of the first electrode 14, with a plurality of conduits 22 for the passage of a refrigerant, for example water.

The gas inlet 20 communicates with a homogenization chamber or plenum 23 formed in a case 24 fixed on the side of the block 15 and having a nozzle 25 for influx of the initial gas mixture, at a pressure lying within the $[0.1\times10^5$ Pa–$3\times10^5$ Pa] range, coming from a source 26 of initial gas mixture.

The electrodes are connected to a high-voltage high-frequency electrical generator 27 operating at a frequency greater than 15 kHz and delivering a power of, for example, about 10 kW. Moreover, this power delivered by the generator may advantageously be expressed as power per surface area of dielectric.

The gas flux containing the excited species, which is available at the outlet 21, is sent to a user station 28, for example for the deposition of a silicon-containing layer on a substrate or alternatively to carry out a step for preparing the surface of a substrate.

An installation such as the one described in relation to FIG. 2, comprising a single apparatus 4 for forming excited or unstable gaseous species (and therefore of the downstream kind) such as the one described in relation to FIG. 3, has been used to carry out an example of implementation of the invention. To do this, specimens of plastic packaging films, made of polypropylene, of dimensions 10 cm×10 cm, were treated under the following conditions:

- the specimen was not heated;
- the energy density employed in the dielectric was about 15 W/cm$^2$;
- the initial treatment gas mixture was nitrogen, with a flow rate of 10 m$^3$/h;
- the adjacent treatment gas mixture, which did not pass through the apparatus for forming excited or unstable gaseous species, consisted of a flow rate of 5 liters/minute of an initial source of 2% silane in argon;
- the residual oxygen partial pressure above the films was of the order of 10 ppm; and
- the distance between the film and the gas outlet was 5 mm and the specimen ran at a speed of 7.5 m/min.

Observation of the deposition carried out under these conditions, using a scanning electron microscope, has shown the formation of a deposition of submicronized particles, the deposition having a perfectly continuous and dense appearance. It was especially important to verify that such a high-quality deposition could occur under low-temperature conditions compatible with the nature of the substrate treated.

Although the present invention has been described in relation to particular embodiments, it is not limited thereby but is, on the contrary, capable of modifications and variants which will appear, to the person skilled in the art, within the framework of the claims hereinbelow.

We claim:

1. A method of forming a gaseous treatment atmosphere for depositing a silicon-containing film on a nonmetallic substrate comprising the steps of:

converting an initial treatment gas mixture into a primary treatment gas mixture in one or more apparatuses for forming excited or unstable gas species, said primary treatment gas mixture comprising excited or unstable gaseous species substantially devoid of electrically charged species;

combining said primary treatment gas mixture with an adjacent treatment gas mixture to form the gaseous treatment atmosphere;

wherein said adjacent treatment gas mixture comprises at least one gaseous silicon precursor which has not passed through said one or more apparatuses;

wherein at least one of said one or more apparatuses for forming excited or unstable gaseous species comprises a first electrode and a second electrode which create a site of an electrical discharge;

and wherein said first and second electrodes extend in an elongated principal direction and said initial treatment gas mixture passes through the discharge created in said apparatus transversely to said electrodes and said elongated principal direction.

2. The method according to claim 1, wherein a layer of a dielectric material is placed on a surface of at least one of the electrodes, opposite the other electrode.

3. The method according to claim 1 further comprising the step of depositing a silicon containing film on a surface of said nonmetallic substrate by bringing said gaseous treatment atmosphere in contact with said nonmetallic substrate.

4. The method according to claim 3, comprising contacting the gaseous treatment atmosphere with the nonmetallic substrate at a pressure close to atmospheric pressure.

5. The method according to claim 3, wherein prior to the step of depositing a silicon film on said nonmetallic substrate, the process further comprises subjecting said nonmetallic substrate to surface preparation by bringing said nonmetallic substrate into contact with a gaseous surface-preparation atmosphere comprising a primary preparation gas mixture, which is obtained by converting, in at least one conversion apparatus, an initial preparation gas mixture, comprising a reducing gas or an oxidizing gas and, optionally, at least one inert gas, into said primary preparation gas mixture comprising excited or unstable gas species and being substantially devoid of electrically charged species.

6. The method according to claim 5, wherein said gaseous surface-preparation atmosphere further comprises, in addition to said primary preparation gas mixture, an adjacent preparation gas mixture which has not passed through said at least one conversion apparatus and which comprises no gaseous silicon precursor.

7. The method according to claim 5, wherein the gaseous preparation atmosphere is brought into contact with the nonmetallic substrate at a pressure close to atmospheric pressure.

8. The method according to claim 5, wherein said at least one conversion apparatus comprises a first electrode and a second electrode which create a site of an electrical discharge.

9. The method according to claim 8, wherein a layer of a dielectric material is placed on a surface of at least one of the conversion apparatus electrodes opposite the other electrode.

10. The method according to one of claims 2 or 9, wherein the energy consumed in each of said one or more apparatuses for forming excited or unstable gas species or in each of said one or more conversion apparatuses, expressed as energy per unit surface area of dielectric, is greater than 1 W/cm$^2$.

11. The method according to claim 10, wherein the energy consumed is greater than 10 W/cm$^2$.

12. The method according to claim 8, wherein said first and second electrodes extend in an elongated principal direction and said initial preparation gas mixture passes through the discharge created in said upstream apparatus transversely to said electrodes and said elongated principal direction.

13. The method according to claim 5, wherein each of said one or more conversion apparatuses for forming excited or unstable gas species includes a gas outlet, the method further comprising bringing the nonmetallic substrate of a given width, the surface of which is to be prepared, opposite the gas outlet or outlets of said one or more conversion apparatuses by a conveying system passing through an internal space delimited by a shrouding assembly, which is isolated from a surrounding atmosphere, said shrouding assembly being sealably connected to said one or more conversion apparatuses or surrounding said one or more conversion apparatuses.

14. The method according to claim 13, wherein a plurality of said conversion apparatuses are present, and said plurality of apparatuses are arranged in parallel to cover the width of the nonmetallic substrate and/or in series so that the nonmetallic substrate is successively brought in front of said gas outlets.

15. The method according to claim 14, wherein the plurality of conversion apparatuses are arranged in series or in series and in parallel, the method further comprising zoning the gaseous surface-preparation atmosphere successively encountered by the nonmetallic substrate, the surface of which is to be prepared, along the conveyor in the following manner:

at least one of the conversion apparatuses for forming excited or unstable gaseous species converts an initial preparation gas mixture which is different from that converted by the conversion apparatus preceding it in said shrouding assembly.

16. The method according to claim 14, wherein the plurality of conversion apparatuses are in series or in series and in parallel, and wherein said gaseous surface-preparation atmosphere further comprises, in addition to said primary preparation gas mixture, one or more adjacent preparation gas mixtures which have not passed through said conversion apparatuses and which comprise no gaseous silicon precursor, said method further comprising the step of zoning the preparation atmosphere successively encountered by the nonmetallic substrate, the surface of which is to be prepared, along the conveyor in the following manner:

a) at least one of the conversion apparatuses for forming excited or unstable gaseous species converts an initial preparation gas mixture different from that converted by the conversion apparatus preceding it in said shrouding assembly; and/or b) the adjacent preparation gas mixture employed with at least one of the conversion apparatuses for forming excited or unstable gaseous species is different from that employed with the conversion apparatus preceding it in said upstream assembly.

17. The method according to claim 16, wherein steps a) and b) take place, and wherein step a) is carried out within the same conversion apparatus employed in step b).

18. The method according to claim 3, wherein each of said one or more apparatuses for forming excited or unstable gas species include a gas outlet, the method further comprising the step of bringing the nonmetallic substrate of a given width to be treated opposite the gas outlet or outlets of said one or more apparatuses by a conveying system passing through an internal space delimited by a shrouding assembly, which is isolated from a surrounding atmosphere, said shrouding assembly being sealably connected to said one or more apparatuses or surrounding said one or more apparatuses.

19. The method according to claim 18, wherein a plurality of said apparatuses for forming excited or unstable gas species are present, and said plurality of apparatuses are arranged in parallel to cover the width of the nonmetallic substrate and/or in series so that the nonmetallic substrate is successively brought in front of said gas outlets.

20. The method according to claim 19, wherein the plurality of apparatuses for forming excited or unstable gas species are arranged in series or in series and in parallel, the method further comprising zoning the gaseous treatment atmosphere successively encountered by the nonmetallic substrate to be treated along the conveyor in the following manner:

a) at least one of the plurality of apparatuses for forming excited or unstable gaseous species converts an initial treatment gas mixture different from that converted by the apparatus preceding it in said assembly; and/or b) the adjacent treatment gas mixture employed with at least one of the plurality apparatuses for forming excited or unstable gaseous species is different from that employed with the apparatus preceding it in said assembly.

21. The method according to claim 20, wherein steps a) and b) take place, and wherein step a) is carried out within the same apparatus that step b) is employed with.

22. The method according to claim 1, wherein said initial treatment gas mixture comprises at least one of an inert gas, a reducing gas, and an oxidizing gas.

23. The method according to claim 1, wherein said adjacent treatment gas mixture comprises, in addition to the at least one gaseous silicon precursor, at least one of an inert gas and a reducing gas and, optionally, an oxidizing gas.

24. The method according to claim 1, wherein the gaseous silicon precursor is $SiH_4$.

25. A device for forming a gaseous treatment atmosphere for depositing a silicon-containing film on nonmetallic substrates, comprising:

a shrouding assembly defining an internal space through which means pass for conveying the nonmetallic substrates to be treated with the gaseous treatment atmosphere, which space is isolated from a surrounding atmosphere, said shrouding assembly sealably connecting or surrounding one or more apparatuses for forming excited or unstable gaseous species;

at least one of said one or more apparatuses for forming excited or unstable gas species comprising at least one tubular gas passage having an axis, formed between an outer electrode and an inner electrode, the electrodes being connected to a voltage means, the outer electrode having an initial gas inlet and a primary gas outlet which are elongate, parallel to the axis and substantially diametrically opposed;

said shrouding assembly is provided with at least one means for injecting an adjacent gas which has not passed through said apparatus or apparatuses for forming excited or unstable gaseous species.

26. The device of claim 25, wherein a plurality of apparatuses for forming excited or unstable gaseous species are present, and said apparatuses are arranged in parallel to cover the width of said nonmetallic substrate, and/or in series so that the nonmetallic substrate is successively brought in front of said gas outlets.

27. The device of claim 25, wherein at least one of the electrodes has, facing the other, a dielectric coating and the outer electrode surrounds the dielectric.

\* \* \* \* \*